United States Patent
Ganitzer et al.

(10) Patent No.: US 10,593,623 B2
(45) Date of Patent: Mar. 17, 2020

(54) SEMICONDUCTOR DEVICE WITH METALLIZATION STRUCTURE ON OPPOSITE SIDES OF A SEMICONDUCTOR PORTION

(71) Applicant: Infineon Technologies AG, Neubiberg (DE)

(72) Inventors: Paul Ganitzer, Finkenstein (AT); Martin Poelzl, Ossiach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/804,396

(22) Filed: Nov. 6, 2017

(65) Prior Publication Data
US 2018/0138120 A1    May 17, 2018

(30) Foreign Application Priority Data

Nov. 17, 2016   (DE) .................. 10 2016 122 162

(51) Int. Cl.
*H01L 23/528*   (2006.01)
*H01L 23/532*   (2006.01)
(Continued)

(52) U.S. Cl.
CPC ...... *H01L 23/528* (2013.01); *H01L 21/32139* (2013.01); *H01L 21/4857* (2013.01); *H01L 21/6836* (2013.01); *H01L 21/78* (2013.01); *H01L 23/482* (2013.01); *H01L 23/49527* (2013.01); *H01L 23/49551* (2013.01); *H01L 23/49562* (2013.01); *H01L 23/49575* (2013.01); *H01L 23/535* (2013.01); *H01L 23/53238* (2013.01); *H01L 29/7813* (2013.01);
(Continued)

(58) Field of Classification Search
CPC ...... C12M 47/10; C12M 25/02; C12M 29/26; C12M 27/02; C12M 37/04; C12M 23/28; C12M 29/18; C12M 29/04; C12M 23/40; C12M 29/00; C12M 23/38; C12M 29/10
See application file for complete search history.

(56) References Cited

U.S. PATENT DOCUMENTS 9,029,200 B2 * 5/2015 Zelsacher ........... H01L 21/6835
                                                    438/121
2007/0278516 A1   12/2007 Hashimoto et al.
(Continued)

FOREIGN PATENT DOCUMENTS

DE    102014116082 A1    5/2016
JP    2009111187 A       5/2009

*Primary Examiner* — Edward Chin
(74) *Attorney, Agent, or Firm* — Slater Matsil, LLP

(57) ABSTRACT

A semiconductor device includes a semiconductor layer with a thickness of at most 50 μm. A first metallization structure is disposed on a first surface of the semiconductor layer. The first metallization structure includes a first copper region with a first thickness. A second metallization structure is disposed on a second surface of the semiconductor layer opposite to the first surface. The second metallization structure includes a second copper region with a second thickness. The total thickness, which is the sum of the first thickness and the second thickness, deviates from the thickness of the semiconductor layer by not more than 20% and a difference between the first thickness and the second thickness is not more than 20% of the total thickness.

16 Claims, 8 Drawing Sheets

(51) Int. Cl.

| | |
|---|---|
| *H01L 23/535* | (2006.01) |
| *H01L 21/78* | (2006.01) |
| *H01L 23/495* | (2006.01) |
| *H01L 21/48* | (2006.01) |
| *H01L 29/78* | (2006.01) |
| *H01L 23/482* | (2006.01) |
| *H01L 21/683* | (2006.01) |
| *H01L 21/3213* | (2006.01) |
| *H01L 23/00* | (2006.01) |
| *H01L 23/31* | (2006.01) |
| *H01L 29/40* | (2006.01) |

(52) U.S. Cl.
CPC ........ *H01L 23/3107* (2013.01); *H01L 23/562* (2013.01); *H01L 29/404* (2013.01); *H01L 29/407* (2013.01); *H01L 2224/48091* (2013.01)

(56) References Cited

U.S. PATENT DOCUMENTS

| | | | |
|---|---|---|---|
| 2008/0035988 A1 | 2/2008 | Hshieh | |
| 2008/0296611 A1 | 12/2008 | Kobayashi et al. | |
| 2010/0244239 A1* | 9/2010 | Bao | H01L 24/03 257/737 |
| 2014/0183543 A1* | 7/2014 | Disney | H01L 29/872 257/76 |
| 2016/0126197 A1* | 5/2016 | Matoy | H01L 23/562 257/666 |

* cited by examiner

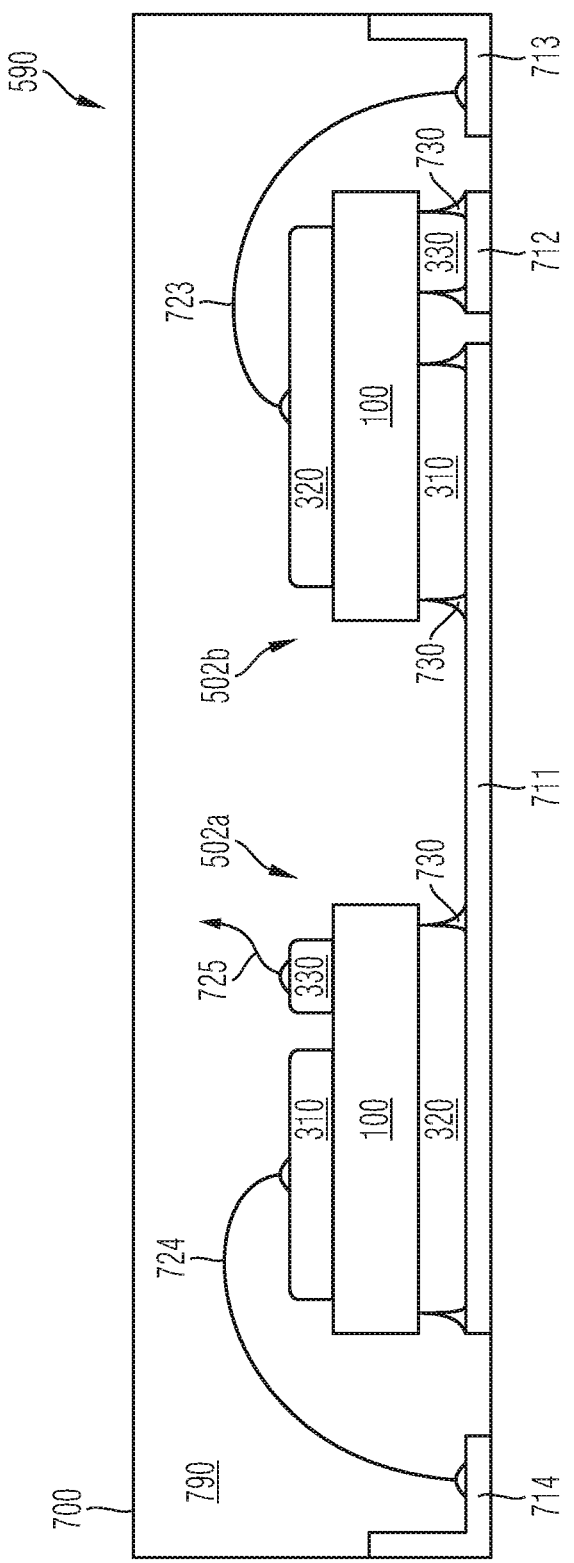

SEMICONDUCTOR DEVICE WITH METALLIZATION STRUCTURE ON OPPOSITE SIDES OF A SEMICONDUCTOR PORTION

CROSS-REFERENCE TO RELATED APPLICATIONS

This application claims priority to German Patent Application No. 102016122162.7, filed on Nov. 17, 2016, which application is hereby incorporated herein by reference.

TECHNICAL FIELD

The present invention relates generally to semiconductor devices, and, in particular embodiments, to semiconductor device with metallization structure on opposite sides of a semiconductor portion.

BACKGROUND

In vertical power semiconductor devices such as power semiconductor diodes and MOSFETs (metal oxide semiconductor field effect transistors) a load current flows from a front side of a semiconductor die to the opposite rear side. Typically, a metallization layer on a rear side of power semiconductor devices is soldered onto a lead frame and wire bonds connect a metallization layer at the front side with further leads of a device package. One way to reduce the on-state or forward resistance of power semiconductor devices is to decrease the distance between the front side and the rear side of the semiconductor die. With decreasing thickness of the semiconductor die, processing of a semiconductor substrate, from which the thin semiconductor dies are obtained, gets more complicated as regards handling and dicing. In addition, handling of the separated thin semiconductor dies becomes more sophisticated.

There is a need for semiconductor devices and methods of manufacturing that at least alleviate issues arising from introducing thin semiconductor substrates in semiconductor production processes.

SUMMARY

The present disclosure concerns a semiconductor device that includes a semiconductor layer with a thickness of at most 50 µm. A first metallization structure is disposed on a first surface of the semiconductor layer. The first metallization structure includes a first copper region with a first thickness. A second metallization structure is disposed on a second surface of the semiconductor layer opposite to the first surface. The second metallization structure includes a second copper region with a second thickness. The total thickness, which is the sum of the first thickness and the second thickness, deviates from the thickness of the semiconductor layer by not more than 20% and a difference between the first thickness and the second thickness is not more than 20% of the total thickness.

The present disclosure further concerns a semiconductor switching assembly that includes a lead frame including a lead with a planar solder portion. Each of a first semiconductor switching device and a second semiconductor switching device includes a semiconductor layer with a thickness of at most 50 µm. A first metallization structure is disposed on a first surface of the semiconductor layer, the first metallization structure including a first copper region with a first thickness. A second metallization structure is disposed on a second surface of the semiconductor layer, the second surface being opposite to the first surface. The second metallization structure includes a second copper region with a second thickness. The total thickness, which is the sum of the first thickness and the second thickness, deviates from the thickness of the semiconductor layer by not more than 20% and a difference between the first thickness and the second thickness is not more than 20% of the total thickness. A lateral section of the first metallization structure of the second semiconductor switching device and the second metallization structure of the first semiconductor switching device are conductively attached on a mounting side of the solder portion of the lead.

The present disclosure also concerns a method of manufacturing a semiconductor device, wherein the method includes forming a flat semiconductor layer that includes device regions of semiconductor devices, wherein a layer thickness is at most 50 µm. A first metallization structure is formed on a process surface of the semiconductor substrate, wherein the first metallization structure includes a first copper region with a first thickness. A second metallization structure is formed on an opposite rear side surface of the semiconductor layer, wherein the second metallization structure includes a second copper region with a second thickness. A total thickness of the first and second thickness deviates by not more than 20% from the layer thickness. A difference between the first and second thickness is not more than 20% of the total thickness.

Further embodiments are defined in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate embodiments of the present invention and together with the description serve to explain principles of the invention. Other embodiments of the invention and intended advantages will be readily appreciated as they become better understood by reference to the following detailed description.

FIG. 4 is a schematic vertical cross-sectional view of a semiconductor switching assembly according to an embodiment concerning a half-bridge circuit in a thin small outline package.

DETAILED DESCRIPTION OF ILLUSTRATIVE EMBODIMENTS

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example, a direct contact between the concerned elements or a low-ohmic connection through a metal and/or a heavily doped semiconductor. The term "electrically coupled" includes that one or more intervening element(s) adapted for signal transmission may be provided between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
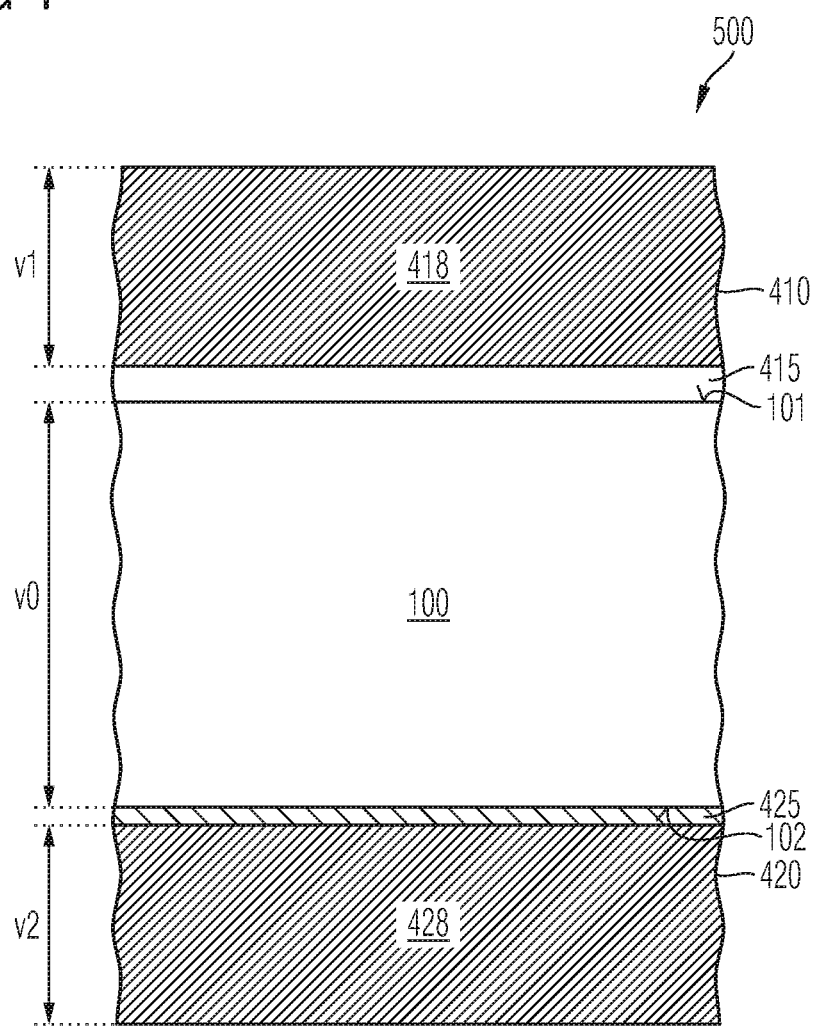
FIG. 1 is a schematic vertical cross-sectional view of a portion of a semiconductor device with a first metallization structure and a second metallization structure on opposite sides and a total copper thickness within the range of the thickness of the semiconductor layer according to an embodiment.

FIG. 1 shows a semiconductor device 500 including a semiconductor layer 100 of a crystalline semiconductor material such as silicon (Si), germanium (Ge), silicon germanium (SiGe), silicon carbide (SiC) or any $A_{III}B_V$ semiconductor. A first surface 101 at the front side of the semiconductor layer 100 is planar or includes planar surface sections. A second surface 102 of the semiconductor layer 100 opposite to the first surface 101 is parallel to the first surface 101 and mainly planar.

Directions parallel to the first surface 101 are horizontal directions. A normal to the first surface 101 defines a vertical direction. A horizontal cross-sectional area of the semiconductor layer 100 may be in a range from 0.5 mm$^2$ to 2 cm$^2$, e.g., in a range from 1 mm$^2$ to 1 cm$^2$. A die thickness v0 from the first surface 101 to the second surface 102 is at most 50 µm, for example in a range from 10 µm to 40 µm.

The semiconductor device 500 is a power semiconductor device with a vertical on-state or forward current flowing from the first surface 101 to the second surface 102 or vice versa. For example, the semiconductor device 500 is a power semiconductor diode, an IGFET, an IGBT (insulated gate bipolar transistor), a thyristor or a semiconductor device including both a HV (high voltage) section including a vertical power semiconductor diode or an IGFET and an LV (low voltage) circuit including, e.g., a short-circuit detection circuit or a temperature control circuit.

The semiconductor layer 100 includes doped regions that form at least one horizontal pn junction. Further, heavily doped regions form ohmic contacts with a first metallization structure 410 at a front side and a second metallization structure 420 on the back. In addition to doped regions, the semiconductor layer 100 may include further insulating and conductive structures, for example gate electrodes, gate dielectrics, field electrodes, field dielectrics and compensation structures in a central device region as well as termination structures in a peripheral device region.

The first metallization structure 410 at the front side includes a first copper region 418 and a first intermediate portion 415 sandwiched between the first copper region 418 and the semiconductor layer 100.

The first copper region 418 is mainly from copper. For example, copper is the only main constituent and a content of impurities is less than 5%, for example, less than 1%. The first copper region 418 has a first thickness v1 and may include a sputtered copper seed layer and an electroplated copper layer, or may consist of a sputtered copper layer.

The first intermediate portion 415 may include a metal portion and a dielectric portion electrically separating different metal portions from each other and/or from conductive structures in the semiconductor layer 100.

For example, in case the semiconductor device 500 includes transistor cells, the first intermediate portion 415 may include an interlayer dielectric separating the metal portion from gate electrodes of the transistor cells.

The metal portion of the first intermediate portion 415 may have a layered structure including layers of different conductive materials, e.g., diffusion barrier liners like copper diffusion barriers, stress relaxing layers and/or adhesion layers.

The second metallization structure 420 includes a second copper region 428 and a second intermediate portion 425 sandwiched between the second surface 102 and the second copper region 428.

The second copper region 428 is mainly from copper. For example, copper is the only main constituent and a content of impurities is less than 5%, for example less than 1%. The second copper region 428 has a second thickness v2 and may include a sputtered copper seed layer and an electroplated layer or may consist of a sputtered copper layer.

The second intermediate portion 425 includes a barrier layer preventing copper atoms to diffuse from the second copper region 428 into the semiconductor layer 100. In addition, the second intermediate portion 425 may include stress-relieving layers and/or adhesion layers. For example, the second intermediate portion 425 may include a barrier layer from titanium, a layer from nickel or nickel vanadium NiV directly adjoining the barrier layer and a layer of silver and/or gold between the layer of nickel and the second copper region 428. The second intermediate portion 425 may further include a ductile layer, for example, from aluminum Al to reduce thermal-mechanical stress. The ductile layer may be sandwiched between the semiconductor layer 100 and the barrier layer, by way of example.

A total thickness v4 of both copper regions 418, 428 given by the sum of the first thickness v1 and the second thickness v2 deviates by not more than 20%, for example, by not more than 10% from the die thickness v0. A difference Δv between the first thickness v1 and the second thickness v2 is not more than 20%, for example, not more than 10% of the total thickness v 4.

For a die thickness v0=50 μm, the total thickness v 4 is in a range from 40 μm to 60 μm. For v4=40 μm, Δv is at most 8 μm and both the first thickness v1 and the second thickness v2 are in a range from 16 μm to 24 μm. Table I summarizes the ranges for v1 and v2 for a die thickness v0=50 μm.

TABLE I

| v4 | Δv | (v1, v2) min | (v1, v2) max |
|----|----|--------------|--------------|
| 40 | 8  | 16           | 24           |
| 50 | 10 | 20           | 30           |
| 60 | 12 | 24           | 36           |

Table II refers to a die thickness v0=20 μm and table III to a die thickness v0=10 μm.

TABLE II

| v4 | Δv  | (v1, v2) min | (v1, v2) max |
|----|-----|--------------|--------------|
| 16 | 3.2 | 6.4          | 9.6          |
| 20 | 4.0 | 8.0          | 12.0         |
| 24 | 4.8 | 10.6         | 14.4         |

TABLE III

| v4 | Δv  | (v1, v2) min | (v1, v2) max |
|----|-----|--------------|--------------|
| 8  | 1.6 | 3.2          | 5.6          |
| 10 | 2.0 | 4.0          | 6.0          |
| 12 | 2.4 | 4.8          | 7.2          |

The comparatively thick metallization at the front and at the rear side mechanically stabilizes a semiconductor substrate from which the semiconductor device 500 is obtained during manufacturing processes. Since the dominating copper regions are symmetrically formed at opposite sides of the semiconductor layer 100, thermo-mechanical stress is induced symmetrically into the semiconductor layer 100 such that the semiconductor layer 100 does not deform and probability for that thermo-mechanical stress results in crystal damage is drastically reduced. For example, the symmetric metallization at the front side and on the rear compensates stress induced during soldering the semiconductor device on a metallic substrate carrier or lead frame. Due to the symmetric metallization at the front side and on the back, the process window for soldering the semiconductor device with the rear side down is the same as the process window for soldering the semiconductor device with the front side down. In both cases, a liquid adhesive or liquid solder squeezed out along the edge of the semiconductor dies can creep up the same distance before reaching the outer surface of the semiconductor layer 100. The increased mechanical stability of the semiconductor device also results in a wider process window for a wire bonding process connecting the concerned metallization layers with leads, because the bond wires can be attached at a higher pressure to the metallization structures. The increased mechanical stability of the semiconductor device also enlarges a process window for pick-up processes picking the semiconductor device from pick-up tapes.

Figure 2A:
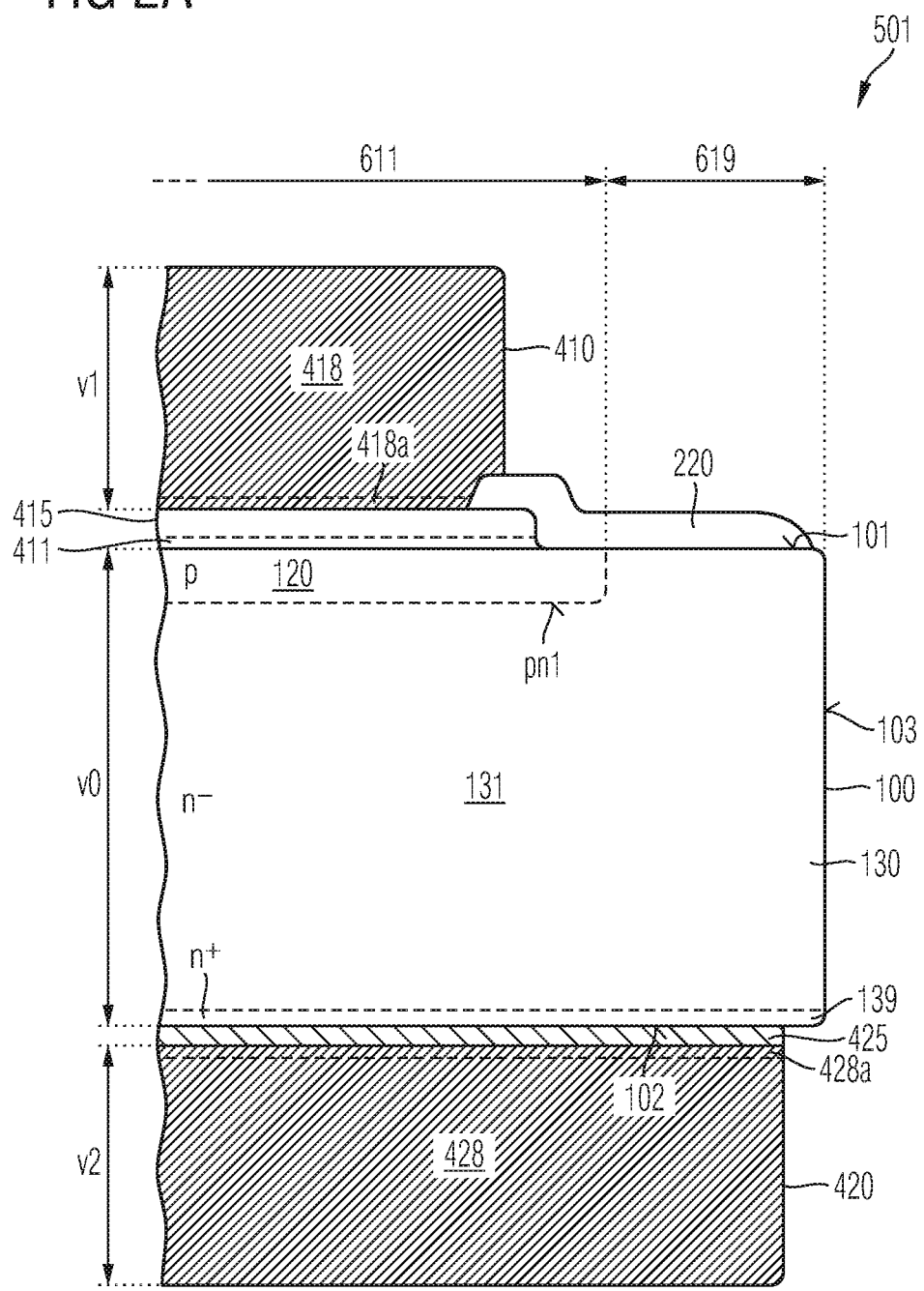
FIG. 2A is a schematic vertical cross-sectional view of a portion of a semiconductor device according to an embodiment concerning a power semiconductor diode.

FIG. 2A shows details of a semiconductor device 500 according to the embodiments by hands of a semiconductor diode 501, wherein the illustrated portion shows a lateral outer surface 103 connecting the first and second surfaces 102. The lateral outer surface 103 may be approximately vertical.

The semiconductor layer 100 includes a p-type anode/body well 120 extending in a central device region 611 from the first surface 101 into the semiconductor layer 100. The anode/body well 120 forms a first pn junction pn1 with a cathode/drain structure 130 that may include, inter alia, a heavily doped contact layer 139 along the second surface 102 and a lightly doped drift zone 131 between the anode/body well 120 and the heavily doped contact layer 139. The anode/body well 120 is absent in a peripheral device region 619 between the central device region 611 and the lateral outer surface 103.

At the front side, a first intermediate portion 415 of a first metallization structure 410 may include a barrier liner 411 directly adjoining the anode/body well 120 in the central device region 611. The first intermediate portion 415 may include one or more further layers, for example a layer of an aluminum copper alloy. The first intermediate portion 415 may be defined by an etching process that uses one lithographic mask for etching all layers of the first intermediate portion 415 such that within the central device region 611 the first intermediate portion 415 is a system of horizontal layers, whereas the first intermediate portion 415 is absent in the peripheral device region 619.

A passivation layer 220 of a dielectric material may selectively cover the sidewalls of the first intermediate portion 415 as well as portions of the first surface 101 of the semiconductor layer 100 between the first intermediate portion 415 and the lateral outer surface 103.

A first copper region 418 of the first metallization structure 410 may include a main portion from electroplated copper and a seed layer 418a from copper sandwiched between the first intermediate portion 415 and the main portion. According to other embodiments, the first copper region 418 is completely formed from sputtered copper.

On the back the second metallization structure 420 includes a second intermediate portion 425, e.g., a sputtered barrier layer from titanium. The second copper region 428 may include a copper seed layer 428a from copper directly adjoining the second intermediate portion 425 and a main portion electroplated on the copper seed layer 428a. According to other embodiments, the second copper region 428 is completely sputtered onto the second intermediate portion 425 that consists of or that includes the barrier layer. An outer edge of the second metallization structure 420 may be spaced from the vertical projection of the lateral outer surface 103.

For further details as regards the first thickness v1 of the first metallization structure 410, the die thickness v0 of the semiconductor layer 100 and the second thickness v2 of the second metallization structure 420, reference is made to the description of FIG. 1.

Figure 2B:
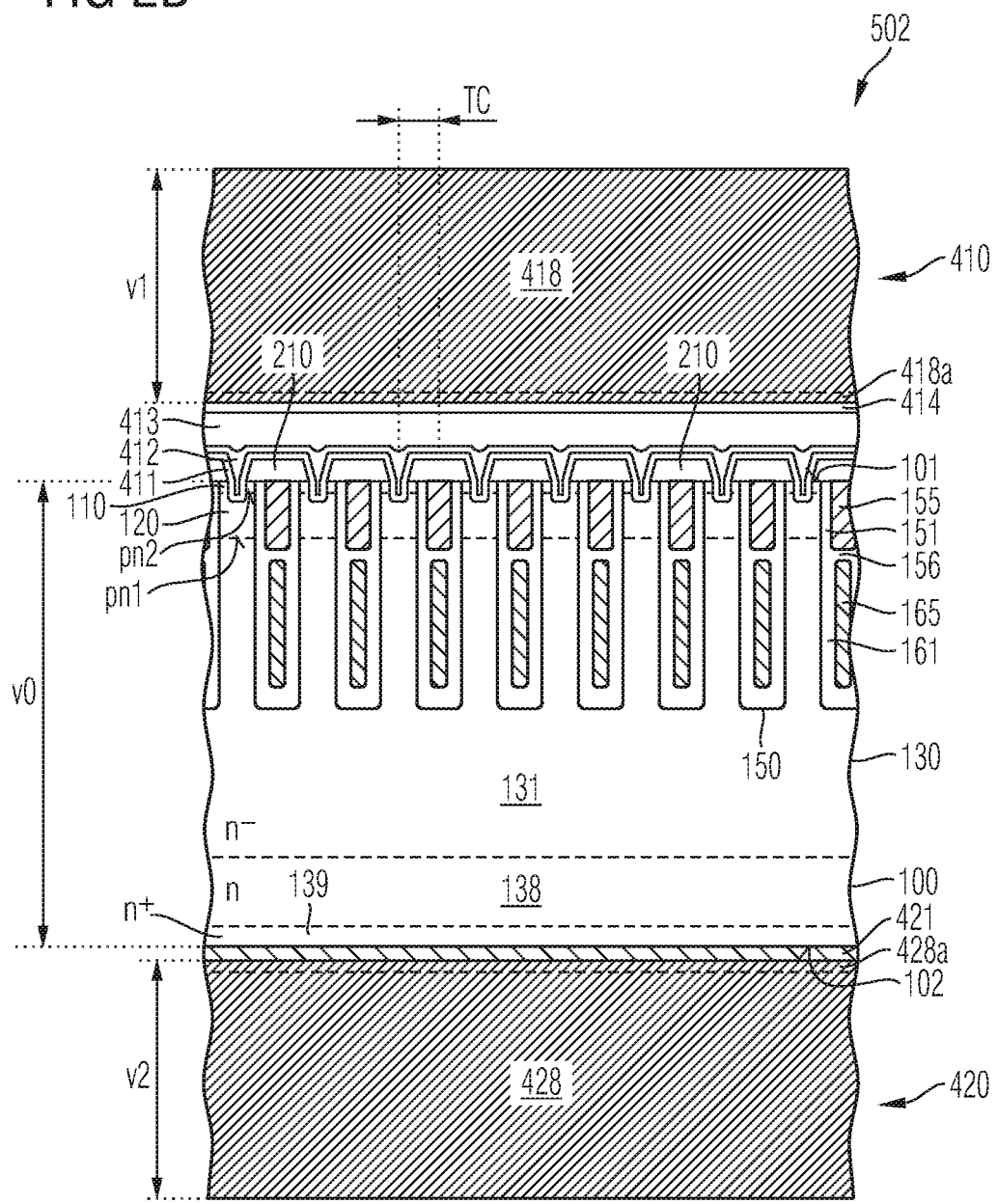
FIG. 2B is a schematic vertical cross-sectional view of a portion of a semiconductor device according to an embodiment concerning an IGFET (insulated gate field effect transistor).

FIG. 2B shows details of a semiconductor device according to the embodiments by hands of a cross-sectional view of an IGFET 502 with a plurality of transistor cells TC electrically connected in parallel to each other.

The semiconductor layer 100 may include trench structures 150 extending from the first surface 101 through the anode/body well 120 into the drift zone 131. In a first portion the trench structures 150 include a conductive field electrode 165 and a field dielectric 161 separating the field electrode 165 from the surrounding semiconductor material of the semiconductor layer 100. Between the first surface 101 and the field electrode 165, the trench structures 150 include a conductive gate electrode 155 and a gate dielectric 151 electrically separating the gate electrode 155 from the anode/body well 120. A separation dielectric 156 separates the gate electrode 155 from the field electrode 165 within the trench structures 150. The gate dielectric 151 is thinner than the field dielectric 161. Each of the gate dielectric 151 and the field dielectric 161 may consist of silicon oxide, for example thermally grown silicon oxide or may include layers of two or more different dielectric materials such as silicon nitride, silicon oxynitride and deposited silicon oxide.

The anode/body well 120 forms body zones of transistor cells between neighboring ones of the trench structures 150 in a central device region 611.

The trench structures 150 may be stripe-shaped with a longitudinal extension perpendicular to the cross-sectional plane exceeding significantly, for example, at least ten times a lateral extension parallel to the cross-sectional plane. According to other embodiments, first trench structures form needle-shaped field plate structures extending from the first surface 101 into the drift zone 131 and second trench structures form a trench gate structure extending from the first surface 101 into the semiconductor layer 100, wherein the trench gate structure forms a grid embedding in each mesh one of the field plate structures.

A source well no may extend from the first surface 101 into the anode/body well 120 and forms second pn junctions pn2 with the anode/body well 120. In addition, a field stop layer 138 with a dopant concentration higher than in the drift zone 131 by at least one order of magnitude and lower than in the contact layer 139 by at least one order of magnitude may be sandwiched between the drift zone 131 and the contact layer 139.

The first intermediate portion 415 includes an interlayer dielectric 210 separating conductive portions of the first intermediate portion 415 from the gate electrode 155. The interlayer dielectric 210 includes one or more layers of dielectric materials such as thermally grown silicon oxide, silicon nitride, silicon oxynitride, deposited silicon oxide formed from TEOS (tetraethylorthosilicate) or a silicate glass. Contact structures 315 extend from a layered conductive portion of the first intermediate portion 415 through openings in the interlayer dielectric 210 to a first surface 101 or through the source well no into the anode/body well 120.

The first intermediate portion 415 includes a barrier liner 411 that contains at least one of titanium, titanium nitride, tantalum and tantalum nitride, wherein the barrier liner 411 lines contact trenches in the semiconductor layer 100, lines the openings in the interlayer dielectric 210 and may cover horizontal portions of the interlayer dielectric 210. A contact fill portion 412 from or including sputtered tungsten covers horizontal portions of the barrier liner 411 and fills at least the narrow portions of the contact structures 315. An alloy layer 413, for example an alloy from aluminum and copper or an alloy of aluminum, copper and silicon covers the contact fill portion 412. An adhesion layer 414 that may contain titanium, tungsten or a combination of titanium and tungsten may be formed between the first copper region 418 and the alloy layer 413. As regards further details, reference is made to the description of FIGS. 1 and 2A.

The second metallization structure 420 includes a barrier layer 421, which is not permeable for copper atoms, from e.g., sputtered titanium.

Figure 3A:
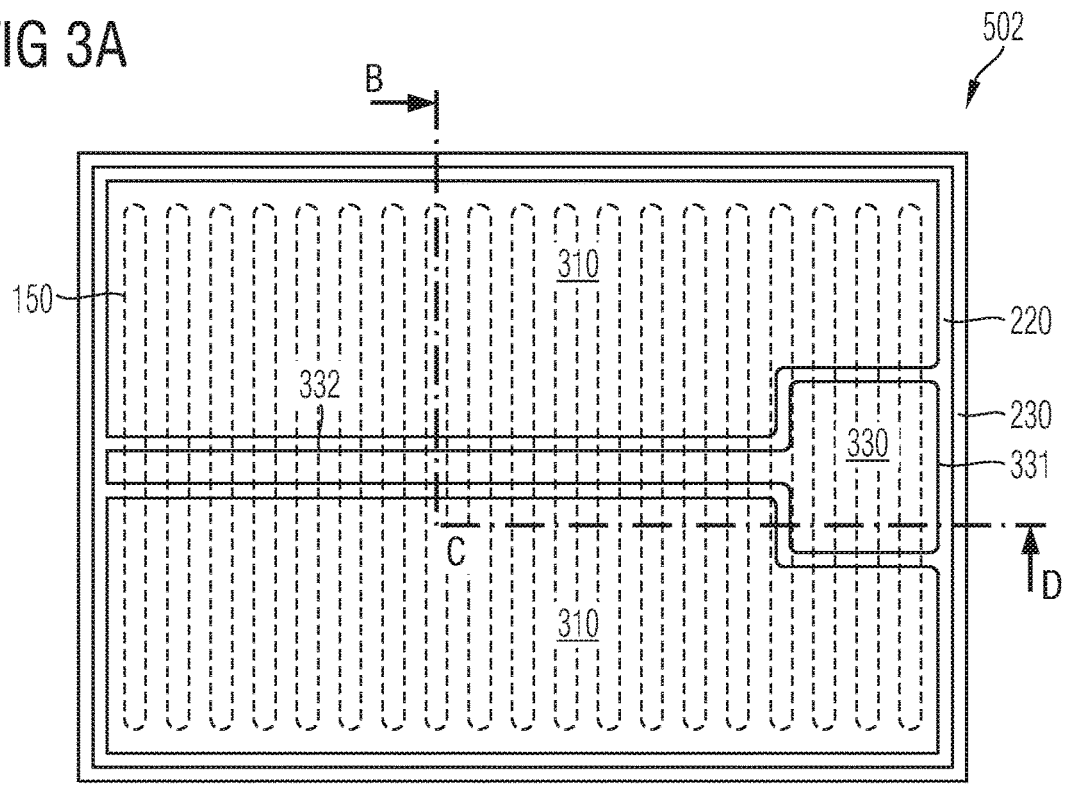
FIG. 3A is a schematic plan view of an IGFET according to an embodiment with the first metallization structure including a first load electrode and a control electrode including a gate pad and gate finger.
Figure 3B:
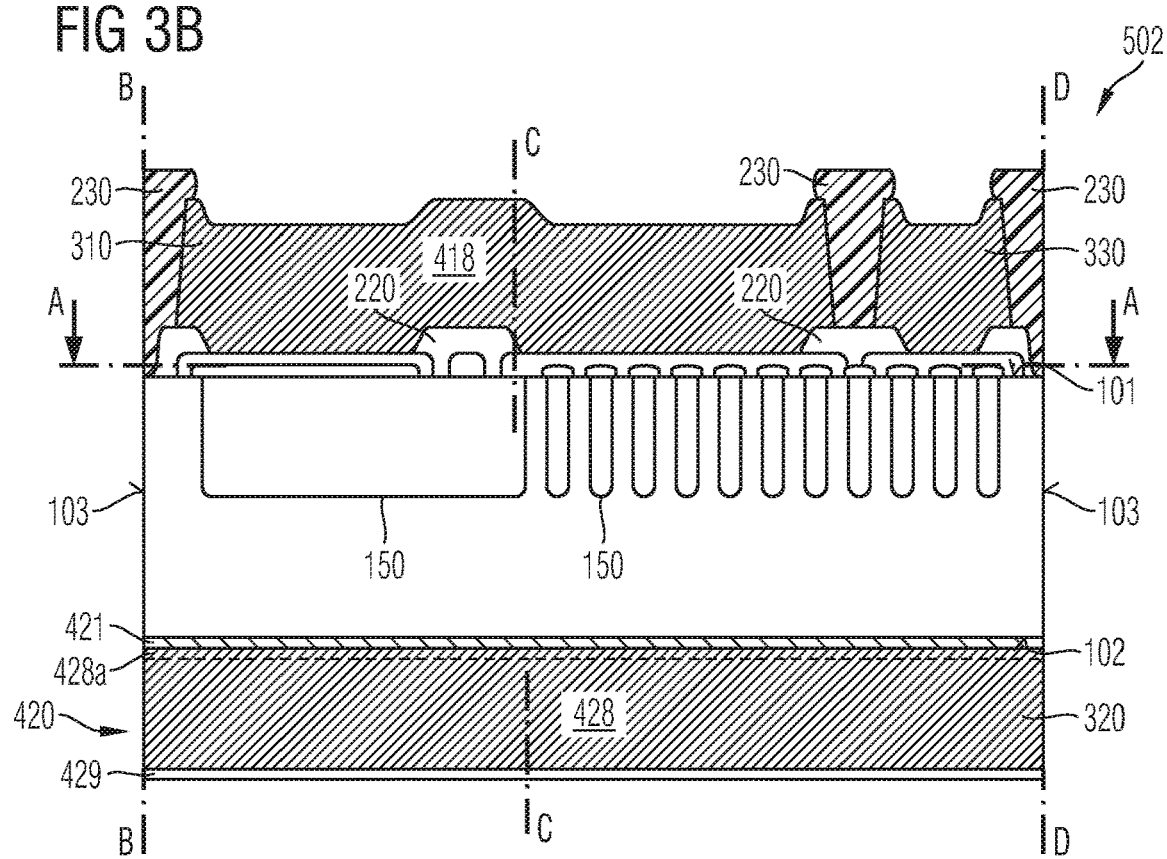
FIG. 3B is a schematic vertical cross-sectional view of the semiconductor device of FIG. 3A along line B-C-D.

FIGS. 3A and 3B refer to an IGFET 502 with the first metallization structure 410 including a first load electrode 310 and a control electrode 330 electrically separated from the first load electrode 310, wherein the first load electrode 310 and the control electrode 330 have the same layer configuration.

The semiconductor layer 100 may include transistor cells TC along trench structures 150 as shown in FIG. 2B, wherein the trench structures 150 extend in a first horizontal direction. A gate finger 332 with the layer configuration of the first intermediate portion 415 extends in a second horizontal direction intersecting, e.g., orthogonally, the first horizontal direction and the trench structure 150. Gate contact structures extending through the interlayer dielectric 210 of FIG. 2D electrically connect the gate electrode 155 in the trench structures 150 with the gate finger 332 and a gate pad 331. The gate pad 331 may be situated along one edge or in a corner of the IGFET 502.

A first lateral section of the conductive portions of the first intermediate portion 415 is electrically connected to the source well no and the anode/body well 120 as illustrated in FIG. 2B. A second lateral section of the conductive portions of the first intermediate portion 415 forms the gate finger 332 and the gate pad 331.

Portions of the passivation layer 220 that cover vertical sidewalls of the first intermediate portion 415 fill and cover gaps between the first lateral section of the first intermediate portion 415 electrically connected to the source well no and the second lateral section of the first intermediate portion 415 electrically connected to the gate electrodes 155. A further passivation layer 230 may fill a gap between a first lateral section of the first copper region 418, which forms a first load electrode 310, and a second lateral section of the first copper region 418, which forms the control electrode 330. The further passivation layer 230 may be from epoxy or polyimide, by way of example.

The second metallization structure 420 forms a second load electrode 320 and may include an auxiliary layer 429 covering the second copper region 428. The auxiliary layer 429 may be an anti-oxidation layer from silver or a soldering support layer, e.g., from tin.

FIG. 4 schematically shows a semiconductor switching assembly 590 in a thin small outline package 700. The package 700 includes a lead frame 710 with several electrically separated leads 711, 712, 713, 714. Solder portions of the leads 711, 712, 713, 714 are coplanar.

A first semiconductor switching device 502a is soldered with the rear side down onto a first lead 711 such that a second load electrode 320 is electrically connected to the first lead 711 by soldering. A second semiconductor switching device 502b is soldered top side down onto the first lead 711 such that the first load electrode 310 is soldered onto the first lead 711. The control electrode 330 may be soldered onto a second lead 712 separated from the first lead 711. The first load electrode 310 and the control electrode 330 of the first semiconductor switching device 502a as well as the second load electrode 320 of the second semiconductor switching device 502b may be wire-bonded to further leads 713, 714. The first and second semiconductor switching devices 502a, 502b may be electrically connected in a half-bridge configuration with both load paths electrically connected in series.

Since both the first load electrode 310 of the second semiconductor switching device 502b and the second load electrode 320 of the first semiconductor switching device 502a have the same, comparatively thick vertical extension, the same solder process with the same relaxed process window can be applied to both semiconductor switching devices 502a, 502b. In both cases, the solder may creep several micrometers up along the sidewalls of the semiconductor device without getting into contact with the lateral outer surface 103 of the semiconductor layer 100. In addition to the first and second semiconductor switching devices 502a, 502b, the package 700 may include further semiconductor devices, for example a gate driver circuit for controlling signals applied to the control electrodes 330 of the first and second semiconductor switching devices 502a, 502b.

FIGS. 5A to 5F concern the manufacture of semiconductor devices with thick front and rear side metallization structures.

Semiconducting regions, for example anode/body wells 120 forming the anode layers of semiconductor diodes or the body zones of transistor cells TC of IGFETs or IGBTs are formed at a front side defined by a front surface 101a of the semiconductor layer 100a in device regions 610, wherein the device regions 610 are arranged in a matrix of orthogonal lines and columns in a horizontal plane and wherein a kerf region 690 separates neighboring device regions 610 from each other. The kerf region 690 forms a grid, wherein one device region 610 is assigned to each mesh of the grid. Insulating and conductive structures, for example, planar gate structures or trench structures including gate structures and/or field plate structures may be formed in each device region 610. A first metallization structure 410 that is electrically connected to the anode/body well 120 is formed in each device region 610.

Figure 5A:
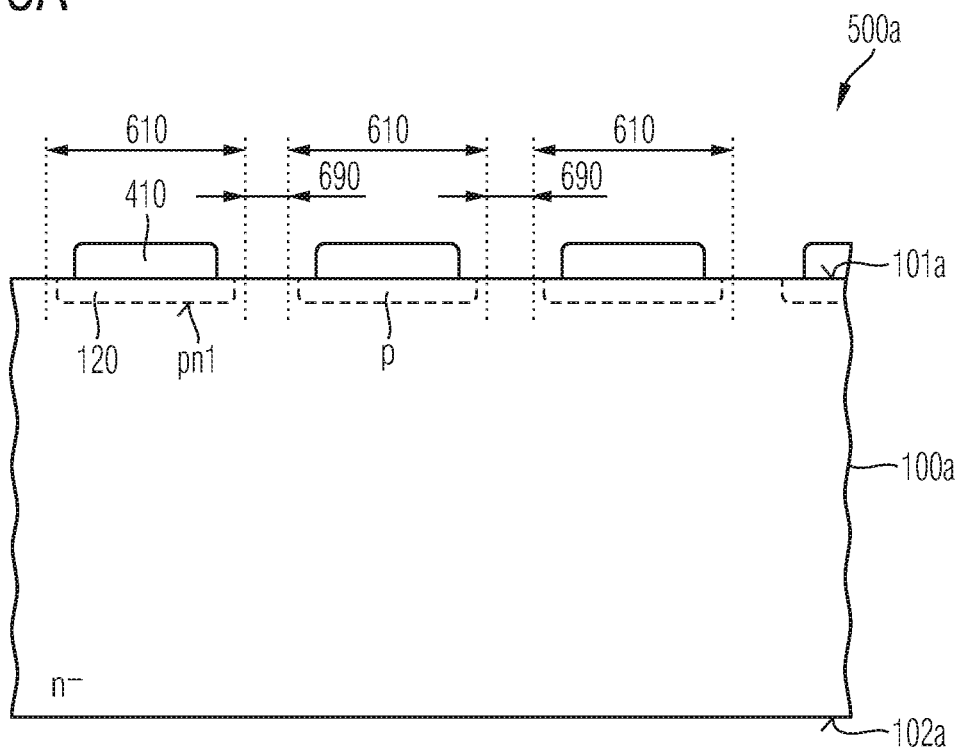
FIG. 5A is a schematic vertical cross-sectional view of a portion of a semiconductor substrate for illustrating a method of manufacturing semiconductor devices according to an embodiment, after forming a first metallization structure at the front side.

FIG. 5A shows a semiconductor substrate 500a including a semiconductor layer 100a with p-type anode/body wells 120 as a pars-pro-toto example of a semiconducting structure for a device region 610, wherein the anode/body well 120 may be the anode layer of a power semiconductor diode or may form the body zones of a transistor cell array that further includes n-type source regions between a front surface 101a of the semiconductor layer 100a and the anode/body well 120.

The first metallization structures 410 include a copper region with a thickness in a range from 5 µm to 30 µm, for example in a range from 8 µm to 20 µm. According to an embodiment, the copper region of the first metallization structure 410 has a thickness of about 10 µm.

A stiff carrier member 810, e.g., a grinding tape may be reversibly attached at the front side of the semiconductor substrate 500a, for example, by adhesion on the first metallization structures 410. The semiconductor layer 100a may be thinned, for example by a splitting process using a porous layer or by a grinding process that starts from the back of the semiconductor layer 100a. For example a grinding wheel grinds the semiconductor layer 100a starting from a support surface iota opposite to the front surface 101a.

Figure 5B:
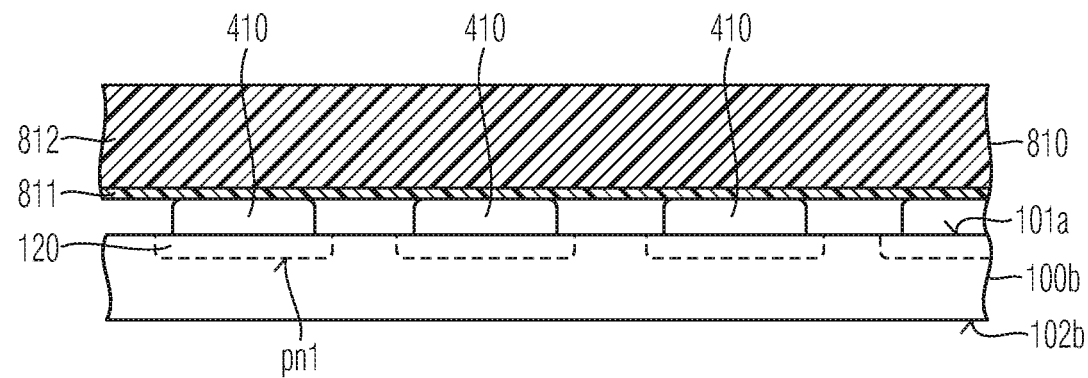
FIG. 5B is a schematic vertical cross-sectional view of the semiconductor substrate portion of FIG. 5A, after applying a carrier member at the front side and thinning the semiconductor substrate from the back.

FIG. 5B shows the carrier member 810, that may be a rigid, non-stretching film, for example a temporary bonding adhesive tape including a PET-LCP (polyethylenterephthalat-liquid crystal polymer) base film 812 and a radiation/thermal release adhesive film 811 for reversibly adhering the base film 812 to the first metallization structures 410. After thinning, a layer thickness v10 of the semiconductor layer 100a is at most 50 µm, e.g., in a range from 10 µm to 40 µm.

The semiconductor layer 100a may be processed from the side of the grinded surface 102b. For example implants may form at least a heavily doped contact layer 139 and/or a less heavily doped field stop layer as described above. A second metallization layer 420a is deposited on the grinded surface 102b and a mask layer 840a is deposited on the second metallization layer 420a.

Figure 5C:
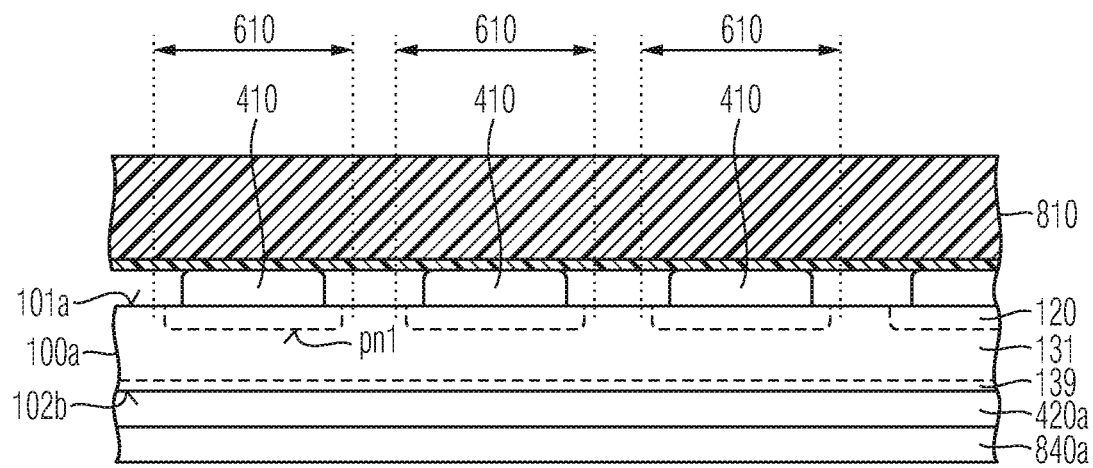
FIG. 5C is a schematic vertical cross-sectional view of the semiconductor substrate portion of FIG. 5B, after forming a second metallization layer and a mask layer at the rear side.

FIG. 5C shows the second metallization layer 420a. The second metallization layer 420a is a layer system including a barrier layer suitable for suppressing diffusion of copper atoms and a copper region with a thickness deviating by not more than 20% from a thickness of a copper region of the first metallization structure 410. The total thickness of the copper region of the second metallization layer 420a and the copper region of the first metallization structure 410 deviates by not more than 20% from the layer thickness v10. The mask layer 840a may be a resist film or may be a combination of a resist film and a hard mask layer between the resist film and the second metallization layer 420a.

A lithography process uses a reticle and a photolithography process to form a wet etch mask 840 from the mask layer 840a of FIG. 5C. During the lithography process, the composite of semiconductor substrate 500a and carrier member 810 lies upside down and information about the position of alignment marks formed at the front side is transferred to the side exposed in the photolithography process by a reflective optical system.

Figure 5D:
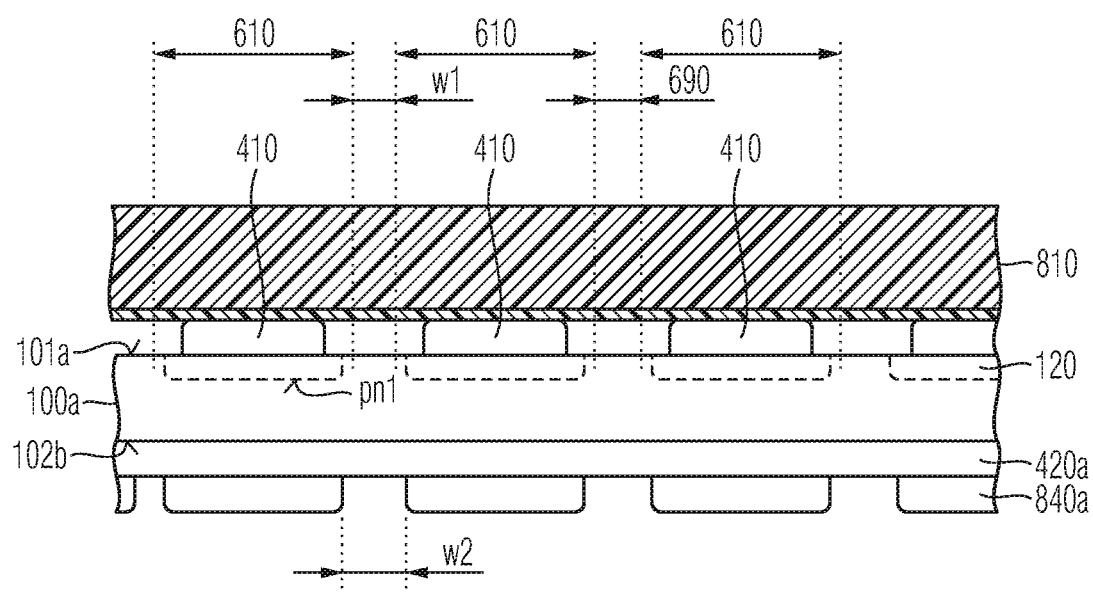
FIG. 5D is a schematic vertical cross-sectional view of the semiconductor substrate portion of FIG. 5C, after forming a wet etch mask from the mask layer.

FIG. 5D shows the wet etch mask 840 formed from the wet etch mask layer 840 of FIG. 5C, wherein mask openings 841 in the wet etch mask 840 are aligned to the kerf regions 690. A width w2 of the mask openings 841 may be greater than a width w1 of the stripes of the kerf region 690.

Figure 5E:
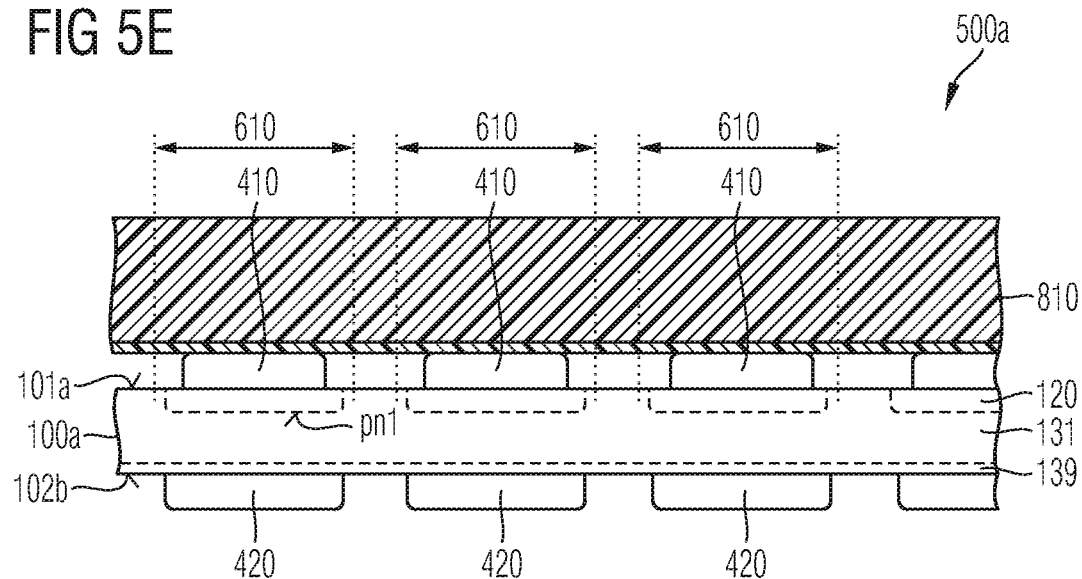
FIG. 5E is a schematic vertical cross-sectional view of the semiconductor substrate portion of FIG. 5D, after patterning the second metallization layer.

Using the wet etch mask 840, the second metallization layer 420a is separated into isolated second metallization structures 420. Gaps between neighboring second metallization structures 420 are in the vertical projection of the gaps between neighboring first metallization structures 410 as illustrated in FIG. 5E. The wet etch mask 840 may be removed.

A sawing frame may be attached to the second metallization structures 420. The carrier member 810 may be removed and a dicing process, for example, mechanical sawing, laser dicing or anisotropic etching dices the semiconductor layer 100a along dicing streets within the kerf region 690.

Figure 5F:
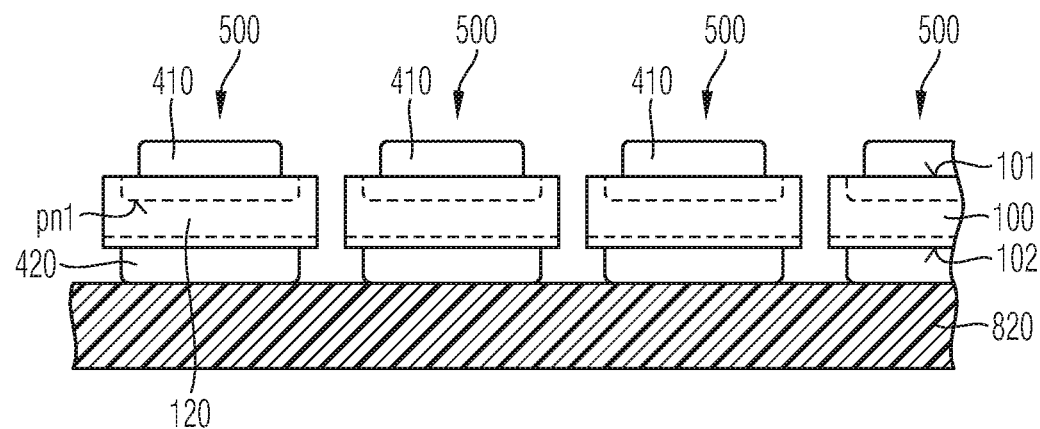
FIG. 5F is a schematic vertical cross-sectional view of semiconductor devices obtained by dicing the semiconductor substrate portion of FIG. 5E.

FIG. 5F shows a number of semiconductor devices 500 with obtained from the semiconductor substrate 500a of FIG. 5E attached on a sawing tape 820, wherein semiconductor layers 100 of the semiconductor devices 500 are obtained from the semiconductor layer 100a of FIG. 5F.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor layer with a thickness of at most 50 μm;
   a first metallization structure disposed on a first surface of the semiconductor layer, the first metallization structure comprising a first copper region with a first thickness;
   a second metallization structure disposed on a second surface of the semiconductor layer, the second surface being opposite to the first surface, wherein the second metallization structure comprises a second copper region with a second thickness, wherein a total thickness, which is the sum of the first thickness and the second thickness, deviates from the thickness of the semiconductor layer by not more than 20% and a difference between the first thickness and the second thickness is not more than 20% of the total thickness;
   a peripheral device region of the semiconductor device between a central device region of the semiconductor device and a lateral outer surface of the semiconductor layer, wherein a lateral outer surface of the first metallization structure is within the central device region, and wherein a lateral outer surface of the second metallization structure is within the peripheral device region; and
   an intermediate region between the first metallization structure and the first surface of the semiconductor layer that is absent from the peripheral device region.

2. The semiconductor device of claim 1, wherein the first and second copper regions comprise electroplated copper.

3. The semiconductor device of claim 1, wherein the total thickness deviates by not more than 10% from the thickness of the semiconductor layer.

4. The semiconductor device of claim 1, wherein the difference between the first thickness and the second thickness is not greater than 10% of the total thickness.

5. The semiconductor device of claim 1, wherein
   the second metallization structure comprises a barrier layer comprising sputtered titanium between the semiconductor layer and the second copper region.

6. The semiconductor device of claim 1, wherein the second copper region comprises a copper seed layer facing the semiconductor layer.

7. The semiconductor device of claim 1, wherein the second metallization structure is devoid of aluminum between the semiconductor layer and the second copper region.

8. The semiconductor device of claim 1, wherein the first metallization structure comprises an alloy layer between the semiconductor layer and the first copper region.

9. The semiconductor device of claim 8, wherein the first metallization structure comprises an adhesion layer containing at least one of tungsten, titanium, and tantalum between the alloy layer and the first copper region.

10. The semiconductor device of claim 1, wherein the first metallization structure comprises a contact fill portion comprising tungsten between the semiconductor layer and the first copper region, the contact fill portion at least partly formed in contact structures extending from the first surface into the semiconductor layer.

11. The semiconductor device of claim 1, wherein the first metallization structure comprises a barrier liner comprising at least one of titanium, titanium nitride, tantalum and tantalum nitride directly adjoining to the semiconductor layer.

12. The semiconductor device of claim 1, further comprising:
   a anode/body well forming a first pn junction with a cathode/drain structure in the semiconductor layer, the anode/body well electrically connected to a first load electrode forming part of the first metallization structure.

13. The semiconductor device of claim 12, wherein
   the cathode/drain structure is electrically connected to a second load electrode forming part of the second metallization structure.

14. The semiconductor device of claim 1, further comprising:
   trench structures extending from the first surface into the semiconductor layer and comprising gate electrodes electrically connected to a control electrode forming part of the first metallization structure.

15. The semiconductor device of claim 1, further comprising:
   a plurality of transistor cells electrically connected in parallel.

16. The semiconductor device of claim 1, wherein the thickness of the semiconductor layer is in a range from 10 μm to 40 μm.

* * * * *